United States Patent
Sridhar et al.

(10) Patent No.: US 10,169,517 B2
(45) Date of Patent: Jan. 1, 2019

(54) METHODS AND SYSTEMS FOR REDUCING CONGESTION IN VERY LARGE SCALE INTEGRATED (VLSI) CHIP DESIGN

(71) Applicant: Wipro Limited, Bangalore (IN)

(72) Inventors: Narayanabhatla Satya Sridhar, Hyderabad (IN); Shashank Pal, Hyderabad (IN); Sandeep Vusirikapally, Khammam (IN); Nirosha Anumandla, Warangal (IN)

(73) Assignee: Wipro Limited, Bangalore (IN)

( * ) Notice: Subject to any disclaimer, the term of this patent is extended or adjusted under 35 U.S.C. 154(b) by 158 days.

(21) Appl. No.: 15/194,845

(22) Filed: Jun. 28, 2016

(65) Prior Publication Data
US 2017/0286585 A1 Oct. 5, 2017

(30) Foreign Application Priority Data
Mar. 29, 2016 (IN) .............................. 201641010895

(51) Int. Cl.
*G06F 17/50* (2006.01)
(52) U.S. Cl.
CPC ...... *G06F 17/5072* (2013.01); *G06F 17/5077* (2013.01); *G06F 17/5081* (2013.01)
(58) Field of Classification Search
CPC ..................... G06F 17/5072; G06F 17/5077
See application file for complete search history.

(56) References Cited

U.S. PATENT DOCUMENTS

| | | | |
|---|---|---|---|
| 7,191,426 B1 * | 3/2007 | Singh ................. | G06F 17/5054 716/104 |
| 9,483,597 B1 * | 11/2016 | Das ...................... | G06F 17/5068 |
| 2006/0265678 A1 * | 11/2006 | Okabe ................ | G06F 17/5072 716/113 |
| 2009/0307642 A1 | 12/2009 | Lai et al. | |
| 2012/0185811 A1 | 7/2012 | Ramachandran et al. | |

* cited by examiner

*Primary Examiner* — Vuthe Siek
(74) *Attorney, Agent, or Firm* — Finnegan, Henderson, Farabow, Garrett & Dunner LLP

(57) ABSTRACT

This disclosure relates generally to Very Large Scale Integrated (VLSI) chips and more particularly to methods and systems for reducing congestion in VLSI chip design. In one embodiment, a method includes applying a placement constraint with at least one hot-spot logic cell, wherein the placement constraint restricts placement of new logic cells within a predefined distance from each of the at least one hot-spot logic cell; applying a routing constraint on a metal layer in a node of the VLSI chip, wherein the node includes the at least one hot-spot logic cell; and restricting fresh placement of the post route database of the at least one hot-spot logic cell to original location extracted using feedback received after culmination of routing procedure while applying the placement constraint and the routing constraint.

17 Claims, 4 Drawing Sheets

METHODS AND SYSTEMS FOR REDUCING CONGESTION IN VERY LARGE SCALE INTEGRATED (VLSI) CHIP DESIGN

TECHNICAL FIELD

This disclosure relates generally to Very Large Scale Integrated (VLSI) chip design and more particularly to methods and systems for reducing congestion in VLSI chip design.

BACKGROUND

Time to market for manufacturing VLSI chips is highly critical for business. To decrease the time to market, a faster physical design implementation along with a timing and Design Rule Check (DRC) sign-off is quintessential.

In advanced fabrication technologies, for example, FinFet and Double Patterning, and at the advanced technology nodes, for example, at 14 nm or 16 nm, the DRCs are very complex and the physical design implementation takes more number of iterations to converge across timing and DRCs. This adds on to the delay in time to market. Additionally, significant manual effort is required to fix the DRCs that cannot be resolved using Electronic Design Automation (EDA) tools. The difficulty that is faced in fixing the DRCs is measured as congestion in physical design implementation.

At advanced technology nodes, congestion has become highly sensitive to the DRCs leading to longer durations in converging. Even a small congestion hot-spot can lead to DRCs that the EDA tools may not be able to fix and thus it may take a long time to fix the congestion hot-spot manually. In some instances, it may not be possible at all to fix such congestion hot-spots. As a result significant delays are caused in closure of physical design implementation.

In conventional systems, to avoid congestion, designers follow the low utilizations approach. However, in order to resolve congestion overflows, utilization should not be lowered unnecessarily as it leads to a substantial increase in the cost.

SUMMARY

In one embodiment, method for reducing congestion in a VLSI chip design is disclosed. The method includes applying a placement constraint with at least one hot-spot logic cell, wherein the placement constraint restricts placement of new logic cells within a predefined distance from each of the at least one hot-spot logic cell; applying a routing constraint on a metal layer in a node of the VLSI chip, wherein the node includes the at least one hot-spot logic cell; and restricting fresh placement of the post route database of the at least one hot-spot logic cell to original location extracted using feedback received after culmination of routing procedure while applying the placement constraint and the routing constraint.

In another embodiment, a system for for reducing congestion in a VLSI chip design is disclosed. The system includes at least one processors and a computer-readable medium. The computer-readable medium stores instructions that, when executed by the at least one processor, cause the at least one processor to perform operations that include applying a placement constraint with at least one hot-spot logic cell, wherein the placement constraint restricts placement of new logic cells within a predefined distance from each of the at least one hot-spot logic cell; applying a routing constraint on a metal layer in a node of the VLSI chip, wherein the node includes the at least one hot-spot logic cell; and restricting fresh placement of the post route database of the at least one hot-spot logic cell to original location extracted using feedback received after culmination of routing procedure while applying the placement constraint and the routing constraint.

In yet another embodiment, a non-transitory computer-readable storage medium for reducing congestion in a VLSI chip design is disclosed, which when executed by a computing device, cause the computing device to: applying a placement constraint with at least one hot-spot logic cell, wherein the placement constraint restricts placement of new logic cells within a predefined distance from each of the at least one hot-spot logic cell; applying a routing constraint on a metal layer in a node of the VLSI chip, wherein the node includes the at least one hot-spot logic cell; and restricting fresh placement of the post route database of the at least one hot-spot logic cell to original location extracted using feedback received after culmination of routing procedure while applying the placement constraint and the routing constraint.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this disclosure, illustrate exemplary embodiments and, together with the description, serve to explain the disclosed principles.

DETAILED DESCRIPTION

Exemplary embodiments are described with reference to the accompanying drawings. Wherever convenient, the same reference numbers are used throughout the drawings to refer to the same or like parts. While examples and features of disclosed principles are described herein, modifications, adaptations, and other implementations are possible without departing from the spirit and scope of the disclosed embodiments. It is intended that the following detailed description be considered as exemplary only, with the true scope and spirit being indicated by the following claims.

Figure 1:
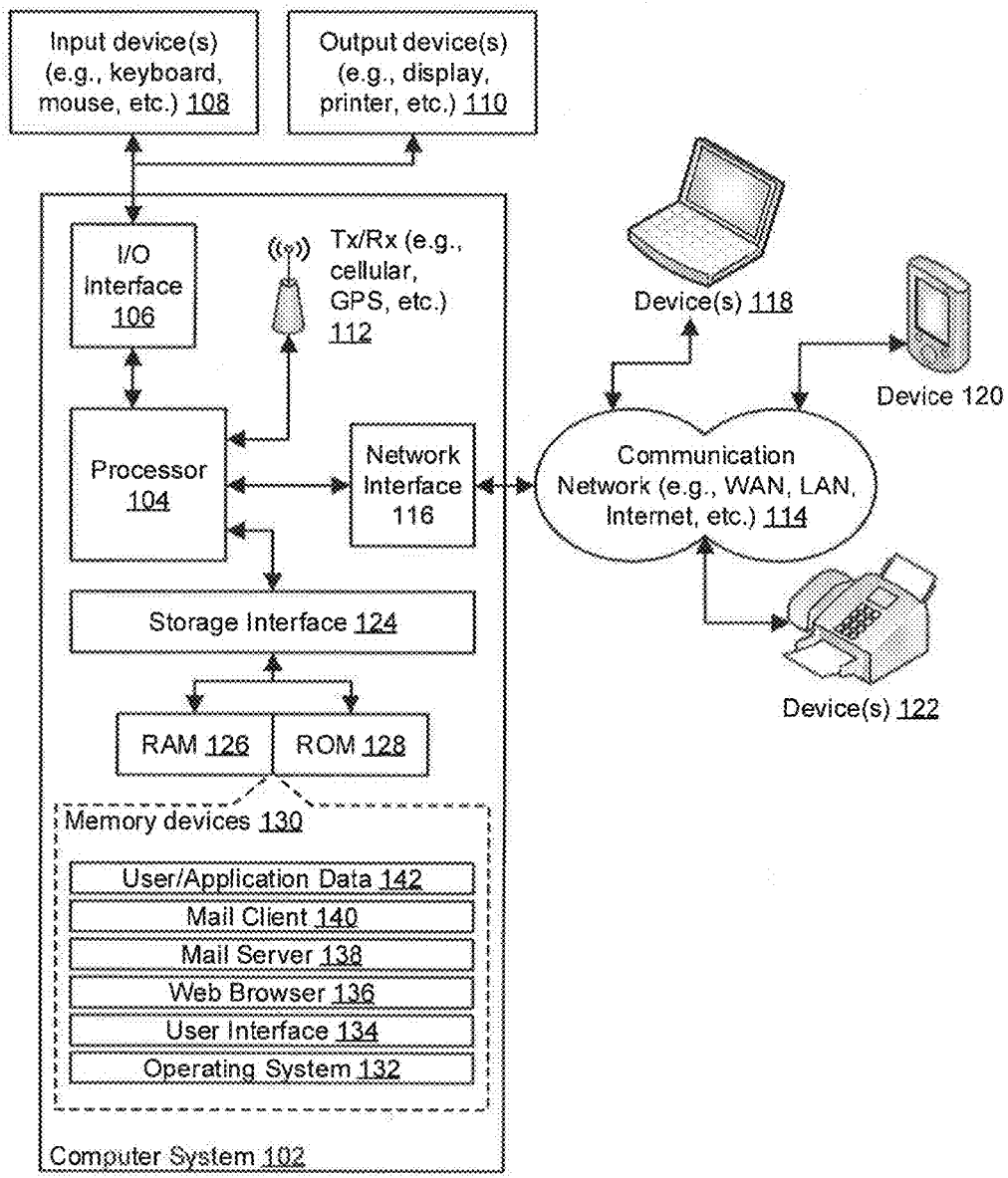
FIG. 1 illustrates a block diagram of an exemplary computer system for implementing various embodiments.

Additional illustrative embodiments are listed below. In one embodiment, a block diagram of an exemplary computer system for implementing various embodiments is disclosed in FIG. 1. Computer system 102 may comprise a central processing unit ("CPU" or "processor") 104. Processor 104 may comprise at least one data processor for executing program components for executing user- or system-generated requests. A user may include a person, a person using a device such as those included in this disclosure, or such a device itself. The processor may include specialized processing units such as integrated system (bus)

controllers, memory management control units, floating point units, graphics processing units, digital signal processing units, etc. The processor may include a microprocessor, such as AMD Athlon, Duron or Opteron, ARM's application, embedded or secure processors, IBM PowerPC, Intel's Core, Itanium, Xeon, Celeron or other line of processors, etc. Processor 104 may be implemented using mainframe, distributed processor, multi-core, parallel, grid, or other architectures. Some embodiments may utilize embedded technologies like application-specific integrated circuits (ASICs), digital signal processors (DSPs), Field Programmable Gate Arrays (FPGAs), etc.

Processor 104 may be disposed in communication with one or more input/output (I/O) devices via an I/O interface 106. I/O interface 106 may employ communication protocols/methods such as, without limitation, audio, analog, digital, monoaural, RCA, stereo, IEEE-1394, serial bus, universal serial bus (USB), infrared, PS/2, BNC, coaxial, component, composite, digital visual interface (DVI), high-definition multimedia interface (HDMI), RF antennas, S-Video, VGA, IEEE 802.n/b/g/n/x, Bluetooth, cellular (e.g., code-division multiple access (CDMA), high-speed packet access (HSPA+), global system for mobile communications (GSM), long-term evolution (LTE), WiMax, or the like), etc.

Using I/O interface 106, computer system 102 may communicate with one or more I/O devices. For example, an input device 108 may be an antenna, keyboard, mouse, joystick, (infrared) remote control, camera, card reader, fax machine, dongle, biometric reader, microphone, touch screen, touchpad, trackball, sensor (e.g., accelerometer, light sensor, GPS, gyroscope, proximity sensor, or the like), stylus, scanner, storage device, transceiver, video device/source, visors, etc. An output device 110 may be a printer, fax machine, video display (e.g., cathode ray tube (CRT), liquid crystal display (LCD), light-emitting diode (LED), plasma, or the like), audio speaker, etc. In some embodiments, a transceiver 112 may be disposed in connection with processor 104. Transceiver 112 may facilitate various types of wireless transmission or reception. For example, transceiver 112 may include an antenna operatively connected to a transceiver chip (e.g., Texas Instruments WiLink WL1283, Broadcom BCM4750IUB8, Infineon Technologies X-Gold 618-PMB9800, or the like), providing IEEE 802.11a/b/g/n, Bluetooth, FM, global positioning system (GPS), 2G/3G HSDPA/HSUPA communications, etc.

In some embodiments, processor 104 may be disposed in communication with a communication network 114 via a network interface 116. Network interface 116 may communicate with communication network 114. Network interface 116 may employ connection protocols including, without limitation, direct connect, Ethernet (e.g., twisted pair 10/100/1000 Base T), transmission control protocol/internet protocol (TCP/IP), token ring, IEEE 802.11a/b/g/n/x, etc. Communication network 114 may include, without limitation, a direct interconnection, local area network (LAN), wide area network (WAN), wireless network (e.g., using Wireless Application Protocol), the Internet, etc. Using network interface 116 and communication network 114, computer system 102 may communicate with devices 118, 120, and 122. These devices may include, without limitation, personal computer(s), server(s), fax machines, printers, scanners, various mobile devices such as cellular telephones, smartphones (e.g., Apple iPhone, Blackberry, Android-based phones, etc.), tablet computers, eBook readers (Amazon Kindle, Nook, etc.), laptop computers, notebooks, gaming consoles (Microsoft Xbox, Nintendo DS, Sony PlayStation, etc.), or the like. In some embodiments, computer system 102 may itself embody one or more of these devices.

In some embodiments, processor 104 may be disposed in communication with one or more memory devices (e.g., RAM 126, ROM 128, etc.) via a storage interface 124. Storage interface 124 may connect to memory devices 130 including, without limitation, memory drives, removable disc drives, etc., employing connection protocols such as serial advanced technology attachment (SATA), integrated drive electronics (IDE), IEEE-1394, universal serial bus (USB), fiber channel, small computer systems interface (SCSI), etc. The memory drives may further include a drum, magnetic disc drive, magneto-optical drive, optical drive, redundant array of independent discs (RAID), solid-state memory devices, solid-state drives, etc.

Memory devices 130 may store a collection of program or database components, including, without limitation, an operating system 132, a user interface application 134, a web browser 136, a mail server 138, a mail client 140, a user/application data 142 (e.g., any data variables or data records discussed in this disclosure), etc. Operating system 132 may facilitate resource management and operation of the computer system 102. Examples of operating system 132 include, without limitation, Apple Macintosh OS X, Unix, Unix-like system distributions (e.g., Berkeley Software Distribution (BSD), FreeBSD, NetBSD, OpenBSD, etc.), Linux distributions (e.g., Red Hat, Ubuntu, Kubuntu, etc.), IBM OS/2, Microsoft Windows (XP, Vista/7/8, etc.), Apple iOS, Google Android, Blackberry OS, or the like. User interface 134 may facilitate display, execution, interaction, manipulation, or operation of program components through textual or graphical facilities. For example, user interfaces may provide computer interaction interface elements on a display system operatively connected to computer system 102, such as cursors, icons, check boxes, menus, scrollers, windows, widgets, etc. Graphical user interfaces (GUIs) may be employed, including, without limitation, Apple Macintosh operating systems' Aqua, IBM OS/2, Microsoft Windows (e.g., Aero, Metro, etc.), Unix X-Windows, web interface libraries (e.g., ActiveX, Java, Javascript, AJAX, HTML, Adobe Rash, etc.), or the like.

In some embodiments, computer system 102 may implement web browser 136 stored program component. Web browser 136 may be a hypertext viewing application, such as Microsoft Internet Explorer, Google Chrome, Mozilla Firefox, Apple Safari, etc. Secure web browsing may be provided using HTTPS (secure hypertext transport protocol), secure sockets layer (SSL), Transport Layer Security (TLS), etc. Web browsers may utilize facilities such as AJAX, DHTML, Adobe Flash, JavaScript, Java, application programming interfaces (APIs), etc. In some embodiments, computer system 102 may implement mail server 138 stored program component. Mail server 138 may be an Internet mail server such as Microsoft Exchange, or the like. The mail server may utilize facilities such as ASP, ActiveX, ANSI C++/C#, Microsoft .NET, CGI scripts, Java, JavaScript, PERL, PHP, Python, WebObjects, etc. The mail server may utilize communication protocols such as internet message access protocol (IMAP), messaging application programming interface (MAPI), Microsoft Exchange, post office protocol (POP), simple mail transfer protocol (SMTP), or the like. In some embodiments, computer system 102 may implement mail client 140 stored program component. Mail client 140 may be a mail viewing application, such as Apple Mail, Microsoft Entourage, Microsoft Outlook, Mozilla Thunderbird, etc.

In some embodiments, computer system 102 may store user/application data 142, such as the data, variables, records, etc. as described in this disclosure. Such databases may be implemented as fault-tolerant, relational, scalable, secure databases such as Oracle or Sybase. Alternatively, such databases may be implemented using standardized data structures, such as an array, hash, linked list, struct, structured text file (e.g., XML), table, or as object-oriented databases (e.g., using ObjectStore, Poet, Zope, etc.). Such databases may be consolidated or distributed, sometimes among the various computer systems discussed above in this disclosure. It is to be understood that the structure and operation of the any computer or database component may be combined, consolidated, or distributed in any working combination.

It will be appreciated that, for clarity purposes, the above description has described embodiments of the invention with reference to different functional units and processors. However, it will be apparent that any suitable distribution of functionality between different functional units, processors or domains may be used without detracting from the invention. For example, functionality illustrated to be performed by separate processors or controllers may be performed by the same processor or controller. Hence, references to specific functional units are only to be seen as references to suitable means for providing the described functionality, rather than indicative of a strict logical or physical structure or organization.

Figure 2:
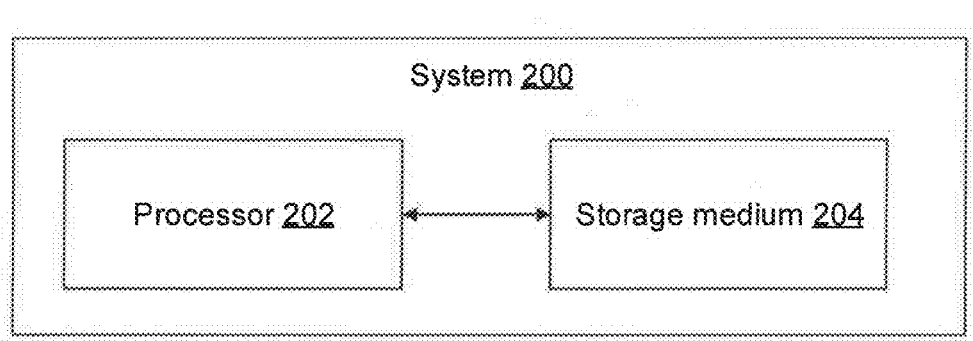
FIG. 2 is a block diagram illustrating a system for reducing congestion in a Very Large Scale Integrated (VLSI) chip design, in accordance with an embodiment.

FIG. 2 is a block diagram illustrating a system 200 for reducing congestion in a Very Large Scale Integrated (VLSI) chip design, in accordance with an embodiment. In particular, system 200 is configured to reduce congestion during VLSI chip design. System 200 includes one or more processors (for example, a processor 202), a storage medium (e.g., a memory) 204. Storage medium 204 stores instructions that, when executed by the one or more processors, cause the one or more processors to reduce congestion during VLSI chip in accordance with various embodiments. In an embodiment, storage medium 204 may be a computer readable medium.

Figure 3:
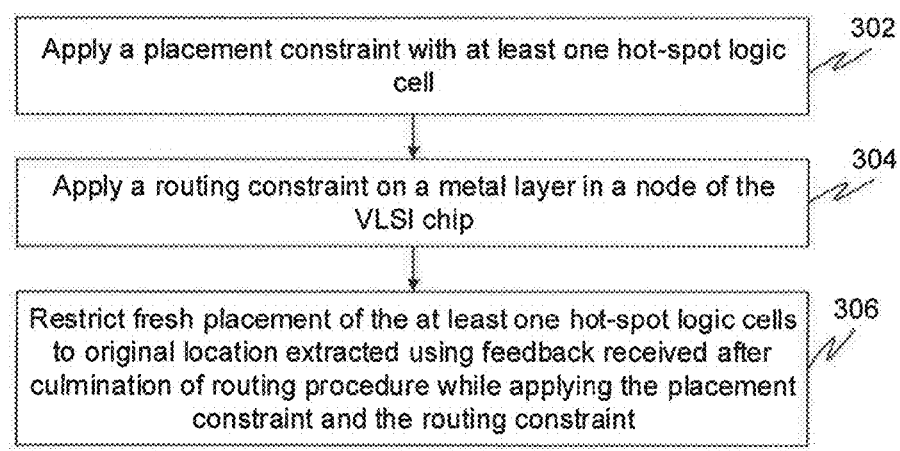
FIG. 3 illustrates a flowchart of a method for reducing congestion in a VLSI chip design, in accordance with an embodiment.

FIG. 3 illustrates a flowchart of a method for reducing congestion in a VLSI chip design, in accordance with an embodiment. To this end, floorplannig is performed based on size of the die that is used for physical design of the VLSI chip by identifying structures that should be placed close together. These structures, for example, may be different logic cells. The structures have to be placed in such a manner that conflicting goals of available space on the die and required performance of the VLSI chip are both met.

After the floorplanning has been performed, placement is performed to assign various circuit components exact locations within the core area of the VLSI chip. Further, for synchronized designs, data transfer between functional elements is synchronized by clock signals. Clock balancing is thus important in order to meet design constraints for the VLSI chip and performance goals. To this end, Clock Tree Synthesis (CTS) is done after placement to achieve the performance goals by minimizing skew and insertion delay. After CTS, the routing process establishes precise paths for interconnections, which include standard cell and macro pins, pins on the block boundary, and pads at chip boundary. All through these processes the design needs to try and achieve critical target parameters like performance, area, power, and meet the Design Rule Checks (DRCs) to enable fabrication of the VLSI chip.

During the routing procedure, the routing of logic connections need to take minimal length, while meeting all the DRCs. Additionally, millions of logical connections need to be routed while meeting timing checks. In order to meet these requirements, the procedure of floorplanning, placement, and optimization are performed such that sufficient routing space is ensured for each logical connection. When logic cells are placed closer in a given area on the die, more logical connections may be required to be routed when compared with the available space on the die. In other words, when routing for the logical connections is made in tracks and availability of tracks is less than the number of logical connections to be routed in a given area, it would lead to hot-spot congestion areas. Each hot-spot congestion area further includes one or more hot-spot logic cells. The number of hot-spot congestion areas at each node may be estimated by determining ratio of logical connections to be made to the available tracks.

To reduce the hot-spot congestion areas, once routing for the VLSI chip design has culminated, a feedback received post culmination of the routing procedure is stored in a post route database. The feedback may be represented using a post route congestion map. This feedback is then used to extract location of the one or more hot-spot congestion areas. Additionally, hot-spot logic cells and their placement location in the hot-spot congestion areas are also identified. Using the identified locations, a placement constraint is applied with one or more hot-spot logic cells at 302. The placement constraint is used to restrict placement of new logic cells within a predefined distance from each of the one or more hot-spot logic cells. In other words, during placement no other logic cell is placed up to a certain distance from a hot-spot logic cell. The distance, for example, may be fixed at 10% of the width of the hot-spot logic cell. Applying a placement constraint avoids high pin density when logic cells are placed very close to each other.

The location of one or more hot-spot congestion areas are identified for each metal layer. Based on this, at 304, a routing constraint is applied on a metal layer in a node of the VLSI chip. The node includes the one or more hot-spot logic cell location. The routing constraint may be applied for each metal layer for the VLSI chip. Therefore, the dimensions, a metal layer, and location of the routing constraint on the metal layer are based on dimension of the one or more hot-spot logic cells. The dimensions and location of the routing constraint may also depend on orientation of the metal layer, as certain metal layer are routed in horizontal direction while others are routed in the vertical direction.

Thereafter, at 306, fresh placement of the post route database of the one or more hot-spot logic cells, for which the location was extracted using feedback received post culmination of the routing procedure, is restricted to their original location while applying the placement constraint and the routing constraint. In other words, during a subsequent run of placement procedure, location of a hot-spot logic cell is restricted to its original location or slightly in the vicinity of the original location during the preceding run of placement procedure. Additionally, while performing the fresh placement of the post route database of the one or more hot-spot logic cells, additional area that would be required owing to the placement constraint and the routing constraint is also taken into account. This ensures that removal of congestion for a hot-spot logic cell does not end up creating new hot-spot logic cells, which did not exist before placement and routing constraints were applied.

The placement constraints, the routing constraint, and restriction to be applied during fresh placement of the post route database enable reduction in the logic cell utilization to reduce the pin density, enable the placement tool to anticipate possible post route congestion, and ensure that a hot-spot logic cell is placed in the same area as in preceding run of the placement procedure. The use of post route database populated with constraints and restriction information enable more efficient removal of congestion hot-spots. As a result of this, significant improvement may be obtained in the convergence of DRCs and timing.

Figure 4:
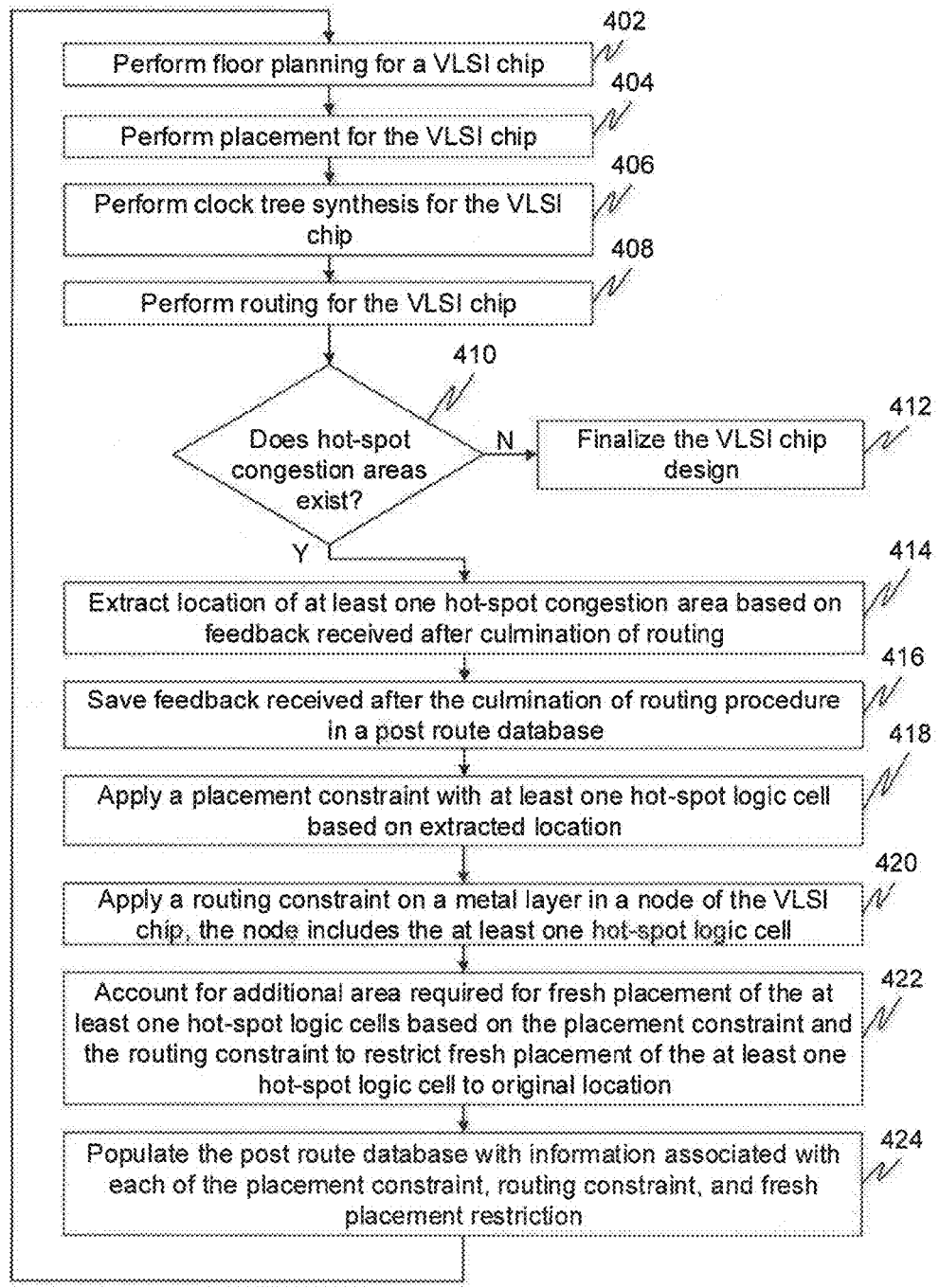
FIG. 4 illustrates a flowchart of a method for reducing congestion in a VLSI chip design, in accordance with another embodiment.

FIG. 4 illustrates flowchart of a method reducing congestion in a VLSI chip design, in accordance with another embodiment. At 402, the procedure of floor planning is performed for the VLSI chip, followed by the placement procedure, performed at 404. Thereafter, at 406, CTS procedure is performed followed by the routing procedure at 408. This has been explained in detail in conjunction with FIG. 3. After the routing procedure has culminated, a check is performed at 410, to determine whether one or more hot-spot congestion areas exist in the post route congestion map. If no hot-spot congestion area exists in the post route congestion map, then the VLSI chip design is finalized at 412.

However, referring back to 410, if one or more hot-spot congestion areas exist in the post route congestion map, location of the one or more hot-spot congestion areas is extracted using feedback received after culmination of the routing procedure at 414. The feedback may be represented as a post route congestion map. The feedback is then saved in a post route database at 416. Thereafter, a placement constraint is applied at 418 followed by applying a routing constraint at 420. Before performing a fresh placement, it is made sure that the location of the one or more hot-spot logic cells is restricted to their original location or slightly in the vicinity during placement, while accounting for additional area required for the applying the placement constraint and the routing constraint at 422. The post route database is then populated with information associated with each of the placement constraint, routing constraint, and fresh placement restriction at 424. Thereafter, 402 to 406 are again repeated using the updated post route database.

Various embodiments of the invention provide methods and systems for reducing congestion in a VLSI chip design. The placement constraints, the routing constraint, and restriction to be applied during fresh placement enable reduction in the logic cell utilization to reduce the pin density, enable the placement tool to anticipate possible post route congestion, and ensure that a hot-spot logic cells is placed in the same area as in preceding run of the placement procedure. The use of post route database populated with constraints and restriction information enable more efficient removal of congestion hot-spots. As a result of this, significant improvement may be obtained in the convergence of DRCs and timing.

The specification has described methods and systems for reducing congestion in a VLSI chip design. The illustrated steps are set out to explain the exemplary embodiments shown, and it should be anticipated that ongoing technological development will change the manner in which particular functions are performed. These examples are presented herein for purposes of illustration, and not limitation. Further, the boundaries of the functional building blocks have been arbitrarily defined herein for the convenience of the description. Alternative boundaries can be defined so long as the specified functions and relationships thereof are appropriately performed. Alternatives (including equivalents, extensions, variations, deviations, etc., of those described herein) will be apparent to persons skilled in the relevant art(s) based on the teachings contained herein. Such alternatives fall within the scope and spirit of the disclosed embodiments.

Furthermore, one or more computer-readable storage media may be utilized in implementing embodiments consistent with the present disclosure. A computer-readable storage medium refers to any type of physical memory on which information or data readable by a processor may be stored. Thus, a computer-readable storage medium may store instructions for execution by one or more processors, including instructions for causing the processor(s) to perform steps or stages consistent with the embodiments described herein. The term "computer-readable medium" should be understood to include tangible items and exclude carrier waves and transient signals, i.e., be non-transitory. Examples include random access memory (RAM), read-only memory (ROM), volatile memory, nonvolatile memory, hard drives, CD ROMs, DVDs, flash drives, disks, and any other known physical storage media.

It is intended that the disclosure and examples be considered as exemplary only, with a true scope and spirit of disclosed embodiments being indicated by the following claims.

What is claimed is:

1. A method of reducing congestion in a Very Large Scale Integrated (VLSI) chip design, the method comprising:
   applying a placement constraint with at least one hot-spot logic cell, wherein the placement constraint restricts placement of new logic cells within a predefined distance from each of the at least one hot-spot logic cell;
   applying a routing constraint on a metal layer in a node of the VLSI chip, wherein the node includes the at least one hot-spot logic cell;
   restricting fresh placement of the at least one hot-spot logic cell to original location extracted using feedback received after culmination of routing procedure while applying the placement constraint and the routing constraint;
   performing placement of circuit components based on the placement constraint and the routing constraint, wherein the routing procedure establishes paths for interconnections, the paths comprising at least one of standard cell and macro pins, pins on block boundary, and pads at chip boundary; and
   fabricating the VLSI chip based on the placement of the circuit components.

2. The method of claim 1 further comprising extracting location of at least one hot-spot congestion area based on feedback received after culmination of routing procedure, the at least one hot-spot congestion area comprising at least one hot-spot logic cell.

3. The method of claim 2, wherein the feedback received after the culmination of routing procedure is saved in a post route database.

4. The method of claim 1, wherein dimensions, the metal layer, and location of the routing constraint are based on dimension of the at least one hot-spot logic cell and orientation of the metal layer.

5. The method of claim 1, wherein restricting comprises accounting for additional area required for fresh placement of the post route database of the at least one hot-spot logic cell based on the placement constraint and the routing constraint.

6. The method of claim 1 further comprising performing fresh placement of a post route database for the VLSI chip design in response to applying the placement constraint and the routing constraint.

7. The method of claim 6 further comprising populating the post route database with information associated with each of the placement constraint, routing constraint, and fresh placement restriction.

8. The method of claim 7, wherein the fresh placement is performed using the post route database after population.

9. A system for reducing congestion in a Very Large Scale Integrated (VLSI) chip design, the system comprising:
  at least one processor; and
  a computer-readable medium storing instructions that, when executed by the at least one processor, cause the at least one processor to perform operations comprising:
    apply a placement constraint with at least one hot-spot logic cell, wherein the placement constraint restricts placement of new logic cells within a predefined distance from each of the at least one hot-spot logic cell;
    apply a routing constraint on a metal layer in a node of the VLSI chip, wherein the node includes the at least one hot-spot logic cell;
    restrict fresh placement of the at least one hot-spot logic cells to original location extracted using feedback received after culmination of routing procedure while applying the placement constraint and the routing constraint;
    perform placement of circuit components based on the placement constraint and the routing constraint, wherein the routing procedure establishes paths for interconnections, the paths comprising at least one of standard cell and macro pins, pins on block boundary, and pads at chip boundary; and
    fabricate the VLSI chip based on the placement of the circuit components.

10. The system of claim 9, wherein the operations further comprise extracting location of at least one hot-spot congestion area based on feedback received after culmination of routing procedure, the at least one hot-spot congestion area comprising at least one hot-spot logic cell.

11. The system of claim 10, wherein the feedback received after the culmination of routing procedure is saved in a post route database.

12. The system of claim 9, wherein dimensions of the routing constraint are based on dimension of the at least one hot-spot logic cell and orientation of the metal layer.

13. The system of claim 9, wherein the operation of restricting comprises operation of accounting for additional area required for fresh placement of the at least one hot-spot logic cell based on the placement constraint and the routing constraint.

14. The system of claim 9, wherein the operations further comprise performing fresh placement of a post route database for the VLSI chip design in response to applying the placement constraint and the routing constraint.

15. The system of claim 14, wherein the operations further comprise populating the post route database with information associated with each of the placement constraint, routing constraint, and fresh placement restriction.

16. The system of claim 15, wherein the fresh placement is performed using the post route database after population.

17. A non-transitory computer-readable storage medium having stored instructions thereon for reducing congestion in a Very Large Scale Integrated (VLSI) chip design, that when executed by a computing device, cause the computing device to:
  apply a placement constraint with at least one hot-spot logic cell, wherein the placement constraint restricts placement of new logic cells within a predefined distance from each of the at least one hot-spot logic cell;
  apply a routing constraint on a metal layer in a node of the VLSI chip, wherein the node includes the at least one hot-spot logic cell; and
  restrict fresh placement of the at least one hot-spot logic cells to original location extracted using feedback received after culmination of routing procedure while applying the placement constraint and the routing constraint;
  perform placement of circuit components based on the placement constraint and the routing constraint, wherein the routing procedure establishes paths for interconnections, the paths comprising at least one of standard cell and macro pins, pins on block boundary, and pads at chip boundary; and
  fabricate the VLSI chip based on the placement of the circuit components.

* * * * *